United States Patent

Mandai et al.

[11] Patent Number: 5,900,845
[45] Date of Patent: * May 4, 1999

[54] ANTENNA DEVICE

[75] Inventors: Harufumi Mandai, Takatsuki; Kenji Asakura, Yasu-gun; Teruhisa Tsuru, Kameoka; Koji Shiroki, Shiga-ken; Seiji Kanaba, Otsu, all of Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/711,719

[22] Filed: Sep. 4, 1996

[30] Foreign Application Priority Data

Sep. 5, 1995 [JP] Japan .................... 7-228126

[51] Int. Cl.⁶ .................................................. H01Q 1/12
[52] U.S. Cl. ................................. 343/895; 343/700 MS; 343/872
[58] Field of Search ............................. 343/700 MS, 702, 343/872, 873, 890, 892, 895

[56] References Cited

U.S. PATENT DOCUMENTS

| 4,598,276 | 7/1986 | Tait et al. ........................... 343/895 |
| 4,644,366 | 2/1987 | Scholz ................................ 343/895 |
| 4,679,051 | 7/1987 | Yabu et al. ......................... 343/700 |
| 4,728,962 | 3/1988 | Kitsuda et al. .................... 343/700 |
| 5,014,071 | 5/1991 | King . |
| 5,402,136 | 3/1995 | Goto et al. ......................... 343/700 |
| 5,412,392 | 5/1995 | Tsunekawa et al. ............... 343/895 |

FOREIGN PATENT DOCUMENTS 0621653  10/1994  European Pat. Off. .
0687030  12/1995  European Pat. Off. .

OTHER PUBLICATIONS

Patent Abstracts of Japan, vol. 95, No. 010, & JP–A–07 288422 (Murata Mfg. Co. Ltd.), Oct. 1995.

*Primary Examiner*—Don Wong
*Assistant Examiner*—Tho Phan
*Attorney, Agent, or Firm*—Ostrolenk, Faber, Gerb & Soffen, LLP

[57] ABSTRACT

An antenna device is provided in which deterioration of characteristics is prevented and which has improved strength. A chip antenna is inserted into a resin case serving as a support member, and one terminal of the resin case is bonded to a power feeding terminal and another terminal of the case is bonded to a fixation terminal of the chip antenna 2 by solder. The chip antenna is fixed to the resin case so that a gap is provided between the printed circuit board on which the chip antenna is mounted and the chip antenna. Then, by bonding the terminals of the resin case to the printed circuit board by solder, the chip antenna is mounted on the printed circuit board.

18 Claims, 5 Drawing Sheets

ANTENNA DEVICE

BACKGROUND OF THE INVENTION

1. Field of the Invention

The present invention relates to an antenna device and, more particularly, to an antenna device for use in mobile communications and local area networks (LAN).

2. Description of the Related Art

A conventional antenna device will now be described with reference to FIG. 6. A chip antenna 90 comprises an insulator layer 91, a laminated coil 92 in the shape of a flat plate, a magnetic-component layer 93, and an external connection terminal 94. This chip antenna 90 is mounted on a printed circuit board 95 and is connected by solder 96, and thus a conventional antenna device is formed.

However, the above-described conventional antenna device has problems, for example, since the chip antenna is directly mounted on a printed circuit board, its flexibility and drop strength are small, and since the printed circuit board and the chip antenna are in contact with each other, the chip antenna is likely to be influenced by the ground electrode on the printed circuit board, causing its characteristics to change from the required characteristics.

SUMMARY OF THE INVENTION

Accordingly, it is an object of the present invention to provide an antenna device in which deterioration of characteristics is prevented and which has improved strength.

To achieve the above-described object, according to the present invention, there is provided an antenna device, comprising: a chip antenna comprising a base; a conductor disposed on at least one of a surface of the base and inside the base, a power feeding terminal provided on the surface of the base for applying a voltage to the conductor; and a support member for mounting the chip antenna on a mounting board, the chip antenna being mounted on the mounting board by the support member with a gap between the chip antenna and the mounting board.

Because of this construction, a gap is formed between the chip antenna and the mounting board on which the chip antenna is mounted by using the support member. Thus, the distance between the chip antenna and the ground electrode on the mounting board is large, making it possible to prevent the characteristics of the antenna from deteriorating.

Further, since the chip antenna is mounted on the mounting board in such a manner as to be held and fixed thereto by a support member, the flexibility and drop strength can be increased.

The above and further objects, aspects and novel features of the invention will become more apparent from the following detailed description when read in connection with the accompanying drawings.

Other features and advantages of the present invention will become apparent from the following description of the invention which refers to the accompanying drawings.

BRIEF DESCRIPTION OF THE DRAWINGS

FIG. 1A(a) is an illustration of the chip antenna disposed inside the antenna device of FIG. 1A;

DETAILED DESCRIPTION OF EMBODIMENTS OF THE INVENTION

The preferred embodiments of an antenna device of the present invention will be described below with reference to the accompanying drawings.

Figure 1A:
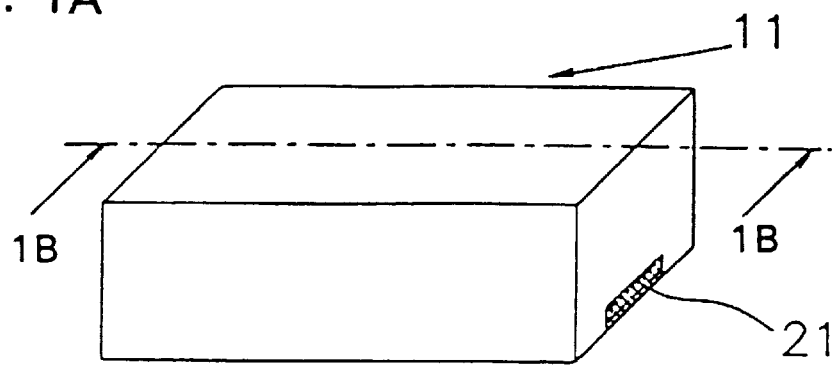
FIG. 1A is an illustration of an antenna device according to a first embodiment of the present invention.
Figure 1A:
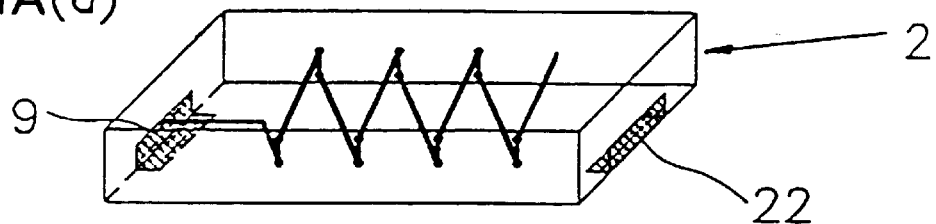
Figure 1B:
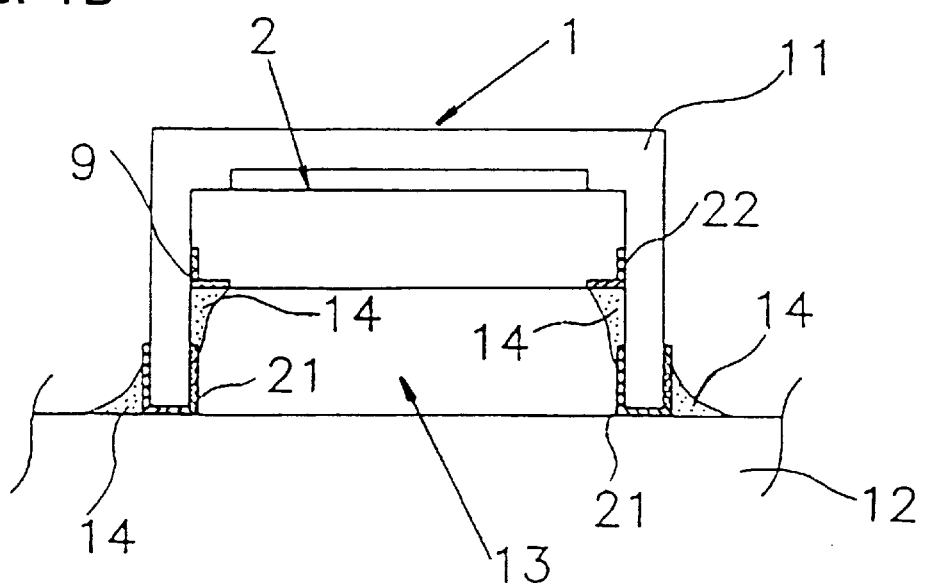
FIGS. 1B is a sectional view of the antenna device taken along the line 1B—1B according to the first embodiment of the present invention.

As shown in FIGS. 1A and 1A(a), a chip antenna 2 is disposed in a resin case 11 serving as a support member. As shown in FIG. 1B, a terminal 21 of the resin case 11 is bonded to B power feeding terminal 9 and another terminal 21 is bonded to a fixation terminal 22 of the chip antenna, 2 by means of, for example, solder 14. In such a case, the chip antenna 2 is supported in the resin case 11 in order that a gap 13 is provided between a printed circuit board 12 for mounting the chip antenna 2 and the chip antenna 2. Then, the chip antenna 2 is mounted on the printed circuit board 12 by bonding terminal 21 of the resin case 11 to the printed circuit board 12 by the solder 14, and thus an antenna device 1 is formed.

Figure 2:
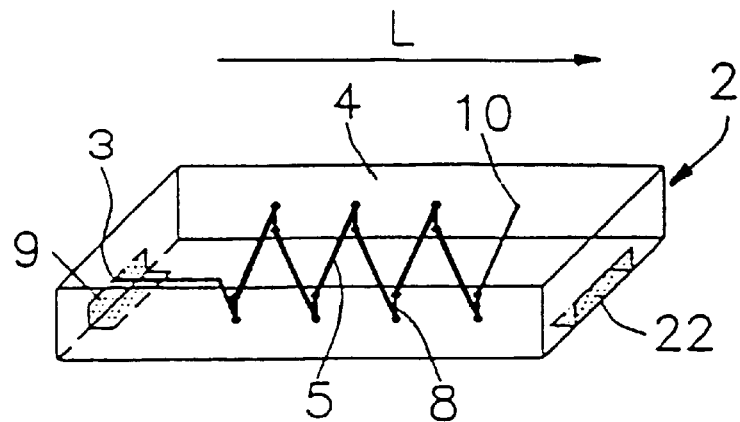
FIG. 2 is a perspective view illustrating a chip antenna structure according to the present invention.
Figure 3:
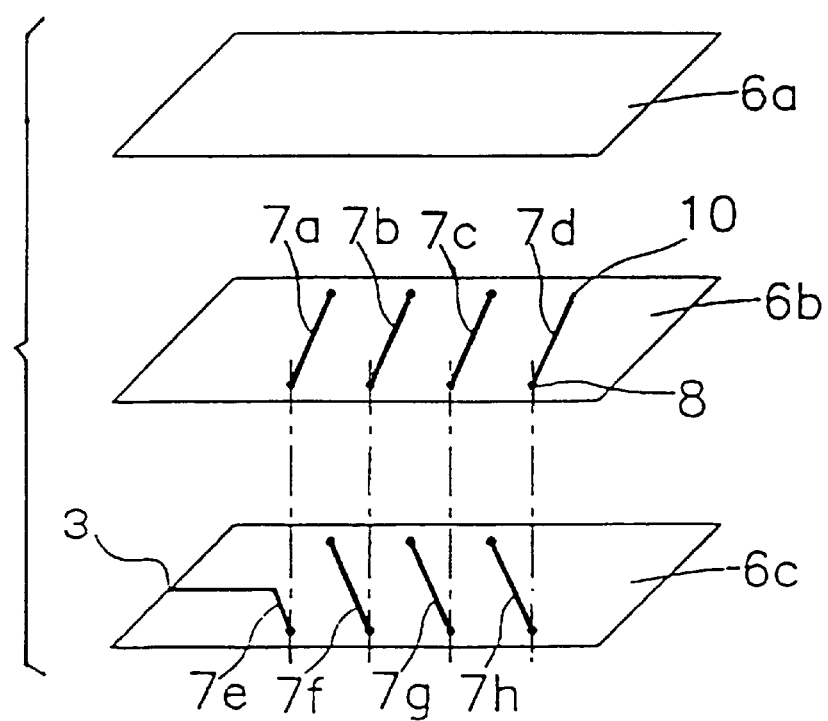
FIG. 3 is an exploded perspective view of the assembly of a dielectric base which constitutes the chip antenna of FIG. 1.

The construction of the chip antenna will be described below with reference to FIGS. 2 and 3.

The antenna device 1 comprises a conductor 5 which is wound around a base 4 in a spiral along the length thereof (in the direction of the arrow L in FIG. 2) inside the base 4 in the shape of a rectangular parallelopiped formed from a dielectric material. The base 4, as shown in FIG. 3, comprises a lamination of dielectric sheets 6a, 6b and 6c in the shape of a rectangle made of a ceramic of mixed components having barium oxide, aluminum oxide and silica as main constituents, or mixed components of a ceramic and a resin. Provided on the dielectric sheets 6b and 6c from among the sheets are conductive patterns 7a to 7h substantially in the shape of a straight line made of copper, a copper alloy or the like by a method, such as printing, vapor deposition, pasting, or plating, etc., and through hole conductors 8 are provided on the dielectric sheet 6b by filling the through hole formed along the width thereof with a conductor. Then, the dielectric sheets 6a and 6c are laminated, and the conductive patterns 7a to 7h are connected via the through hole conductors 8. Thus, a conductor 5 in the shape of a spiral whose cross section is rectangular is windingly formed along the length (in the direction of the arrow L in FIG. 2) of the base 4. Further, one end (one end of the conductive pattern 7e) of the conductor 5 is extended onto a surface of the base 4 and formed on a surface of the base 4, further forming a power feeding terminal 3 which is connected to the power feeding terminal 9 for applying a voltage to the conductor 5. The other end (one end of the conductive pattern 7d) of the conductor 5 forms a free end 10 inside the base 4. Then, the power feeding terminal 9 to which the power feeding terminal 3 of the conductor 5 is connected is formed on one side of the base 4, and the fixation terminal 22 for holding and fixing the chip antenna 2 to the support member is formed on the other side of the base 4, and thus the chip antenna 2 is formed. The power feeding terminal 9 serves also as a fixation terminal.

By holding and fixing the chip antenna 2 in the resin case 11 as described above, the flexibility and drop strength are increased. Further, by providing the gap 13 between the chip antenna 2 and the printed circuit board 12, it is possible to prevent the characteristics of the chip antenna from deteriorating or changing.

Figure 4A:
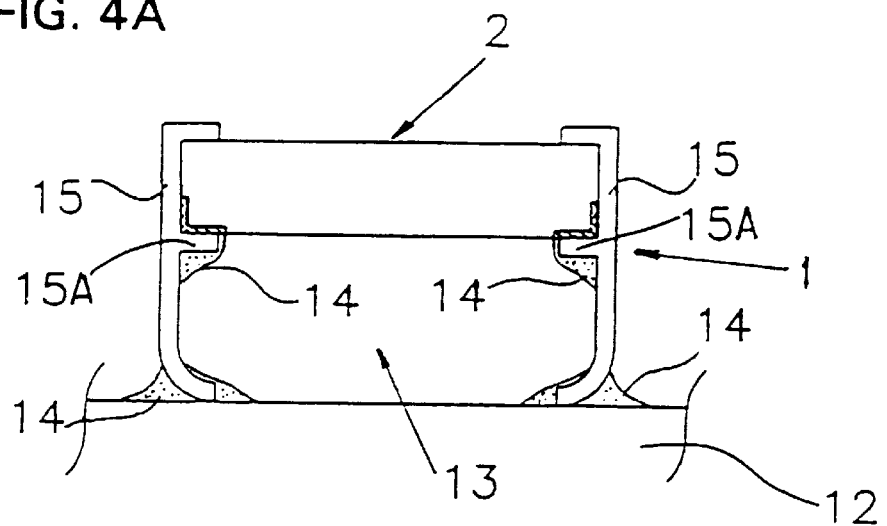
FIGS. 4A, 4B and 4C are sectional views illustrating an antenna device according to other embodiments of the present invention.
Figure 4B:
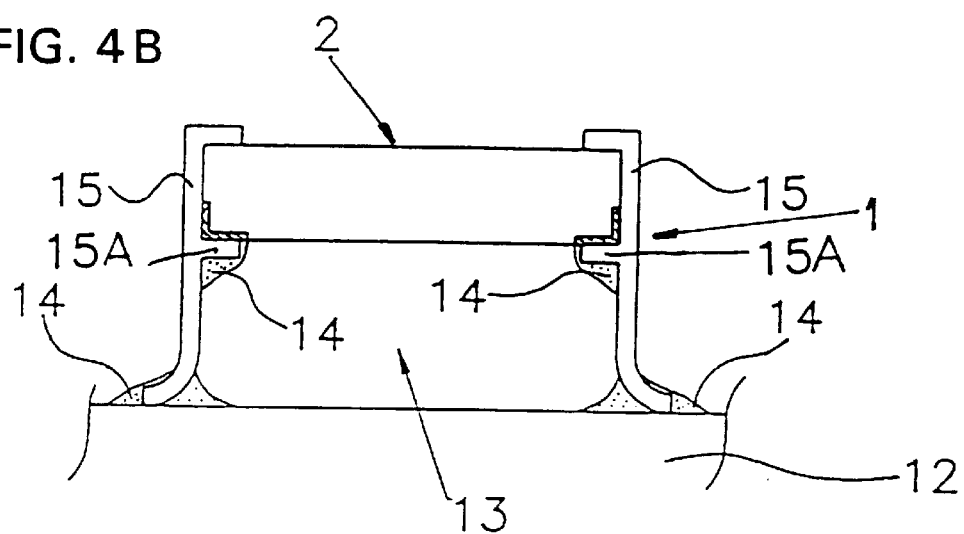
Figure 4C:
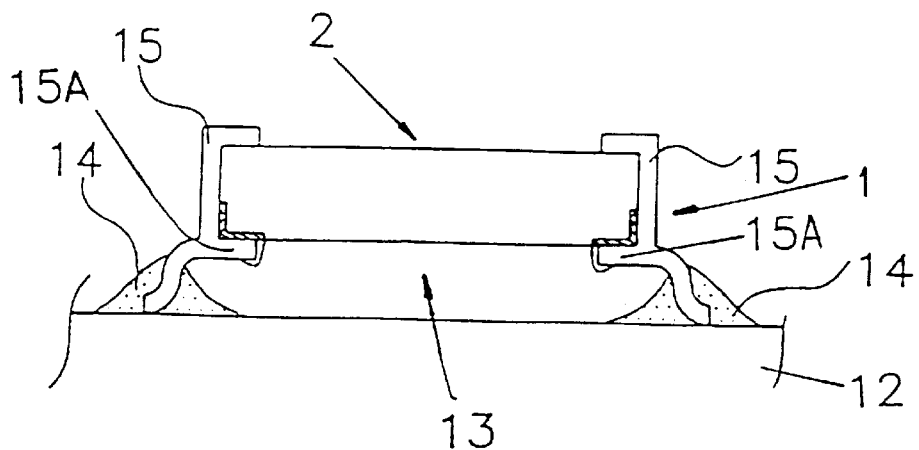

Also, as shown in FIGS. 4A, 4B and 4C, a J-bend 15 may be used as a support member. The shape of the J-bend may be those shapes shown in FIGS. 4A to 4C, and can be changed in various ways according to uses of the chip antenna.

Further, in order to provide support for the chip antenna 2 and provide a convenient point for soldering, the support members 15 have ledges 15A provided thereon.

Figure 5A:
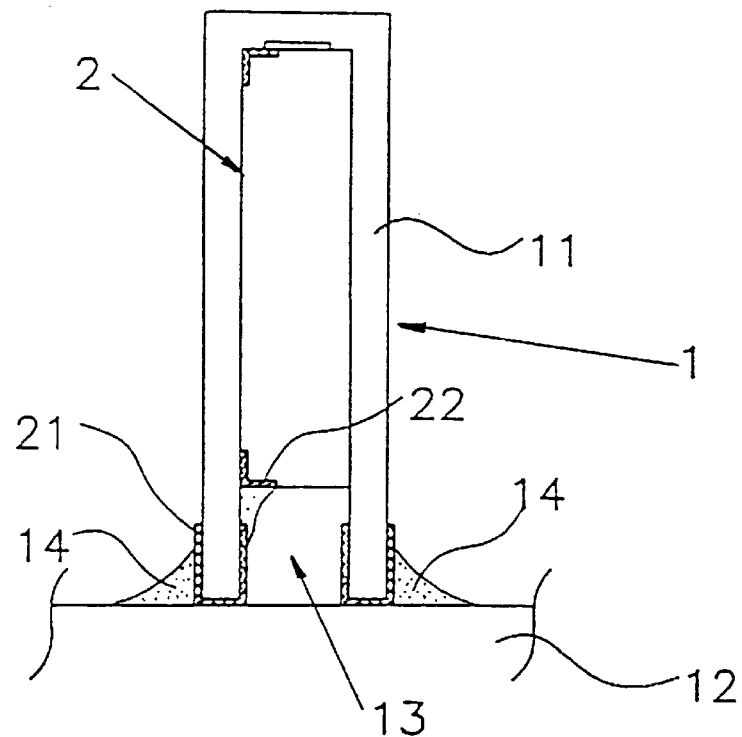
FIGS. 5A and 5B are sectional views illustrating an antenna device according to still yet other embodiments of the present invention.
Figure 5B:
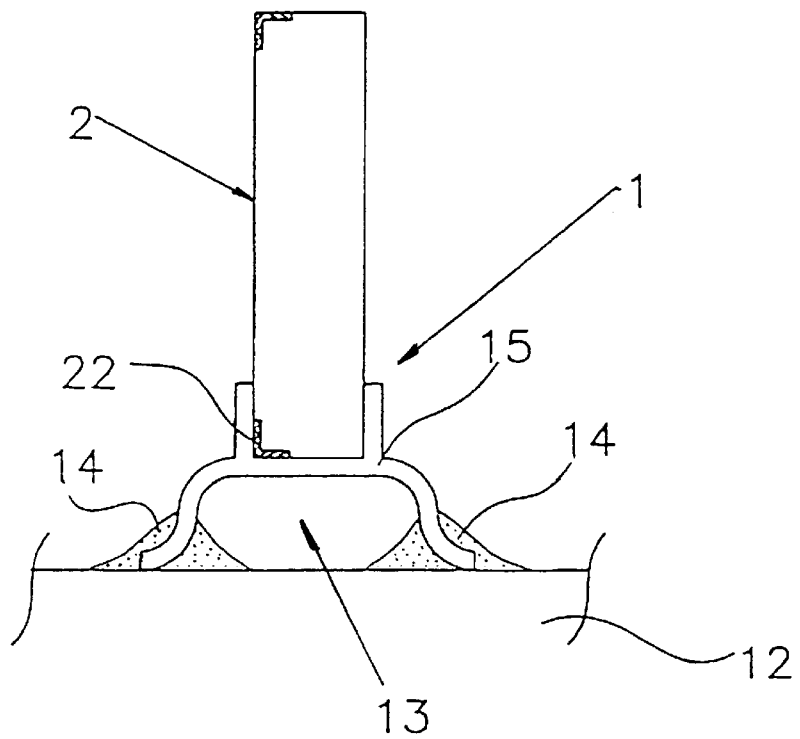
Figure 6:
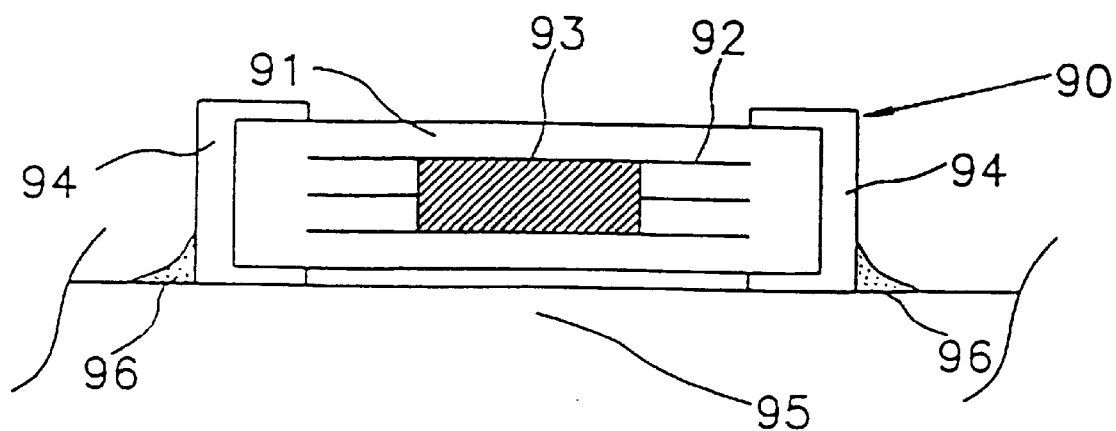
FIG. 6 is a sectional view illustrating a conventional antenna device.

Further, as shown in FIGS. 5A and 5B, the chip antenna 2 may be mounted on the printed circuit board 12 in such a manner as to be vertically fixed to the fixation member. By vertically mounting the chip antenna 2 on the printed circuit board 12 in this way, the chip antenna 2 is less likely to be affected by the ground electrode on the printed circuit board 12, and therefore, it is possible to prevent the characteristics of the chip antenna from deteriorating.

In the above-described chip antenna, the winding shape of the conductor is not limited to the shape of a square or rectangle, but may be a circular shape or substantially an oval shape having a straight line in a part thereof, or a substantially semicircular shape, and the conductor may be formed on the surface of the dielectric base. Although the dielectric base is preferably formed by laminating a plurality of dielectric base layers, the dielectric base may be formed from, for example, a single, unlaminated dielectric block. Further, the material of the base is not limited to a dielectric material. Even if, for example, a base formed by using a magnetic material having ferrite formed from Ni, Co or Fe as main constituents or a base formed by combining a dielectric material and a magnetic material is used, advantages comparable to the case in which a dielectric material is used can be obtained. Further, the shape of the base is not limited to a rectangular parallelopiped shape, but may be changed as required, for example, to a polyhedron-type shape, a barrel-type shape, or a circular cylinder-type shape.

In the antenna device of the present invention, as described above, when a chip antenna is mounted, a gap is formed between the chip antenna and a base for mounting the chip antenna by using a support member. Thus, the distance between the chip antenna and a ground electrode on the base is large, and it becomes possible to prevent the characteristics of the antenna from deteriorating or changing. In addition, since the chip antenna is mounted on the base in such a manner as to be held and fixed by the support member, it becomes possible to increase the flexibility and the drop strength by holding and fixing the chip antenna onto the base by means of a support member.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An antenna device, comprising:
   a chip antenna comprising: a base comprising a three dimensional object having a plurality of surfaces;
   a conductor disposed inside said base;
   a power feeding terminal provided on the surface of said base for applying a voltage to said conductor such that the chip antenna forms a mono-pole antenna; and
   said base comprising a plurality of dielectric layers stacked on top of each other, each dielectric layer having a surface, the stacked dielectric layers establishing a direction normal to the stacked dielectric layers, portions of the conductor disposed spirally on the surfaces of different ones of the dielectric layers and having a spiral axis extending perpendicular to the direction normal to the stacked dielectric layers; and
   a support member for mounting said chip antenna on a mounting board, said chip antenna being mounted on said mounting board by said support member with a gap between the chip antenna and the mounting board.

2. The antenna device of claim 1, wherein the support member comprises a case enclosing the chip antenna and receiving the chip antenna in an inner recess of the case, the recess being open on one side facing the mounting board, the chip antenna being disposed in the recess so that the chip antenna is held at a distance from the mounting board defining said gap.

3. The antenna device of claim 2, wherein the case comprises a resin case.

4. The antenna device of claim 1, wherein the support member comprises a power feeding terminal coupled to the power feeding terminal on the base and a fixation terminal coupled to a fixation terminal on the base.

5. The antenna device of claim 4, wherein the support member comprises respective conducting extending members engaging the base and electrically connected respectively with the power feeding terminal on the base and the fixation terminal on the base.

6. The antenna device of claim 5, wherein the extending members each have a ledge for supporting the chip antenna at a distance from the mounting board defining said gap.

7. The antenna device of claim 5, wherein the extending members each have a flared end for fixation onto the mounting board.

8. The antenna device of claim 7, wherein the extending members are flared outwardly.

9. The antenna device of claim 7, wherein the extending members are flared inwardly.

10. The antenna device of claim 1 wherein the chip antenna has a broad surface, the broad surface being disposed coplanar with the mounting board.

11. The antenna device of claim 1, wherein the chip antenna has a broad surface, the broad surface being disposed perpendicular to the mounting board.

12. The antenna device of claim 1, wherein the base comprises a plurality of laminated layers, each having a portion of the conductor disposed thereon, at least one through hole being provided on at least one of said layers for interconnecting the portions of the conductor to form said conductor.

13. The antenna device of claim 1, wherein the base comprises a unitary block of material.

14. The antenna device of claim 1, wherein the base comprises one of a dielectric material, a magnetic material or a combination of a magnetic material and a dielectric material.

15. The antenna device of claim 1, wherein the conductor is rectangular in cross-section.

16. The antenna device of claim 1, wherein the base is one of a rectangular parallelopiped and a polyhedron.

17. The antenna device of claim 1, wherein the support member increases flexibility and drop strength of the antenna device.

18. The antenna device of claim 1, wherein the gap reduces influence of a ground electrode on the mounting board on the antenna device.

* * * * *